United States Patent

Nagano et al.

[11] Patent Number: 4,493,884
[45] Date of Patent: Jan. 15, 1985

[54] LIGHT-SENSITIVE COMPOSITION

[75] Inventors: Teruo Nagano, Kanagawa; Akira Nagashima, Shizuoka, both of Japan

[73] Assignee: Fuji Photo Film Co., Ltd., Kanagawa, Japan

[21] Appl. No.: 497,282

[22] Filed: May 23, 1983

[30] Foreign Application Priority Data

May 21, 1982 [JP] Japan ................................. 57-85765

[51] Int. Cl.³ ........................... G03C 1/60; G03F 7/08
[52] U.S. Cl. ........................................ 430/192; 430/5; 430/165; 430/190; 430/191; 430/302; 430/311; 430/326; 430/331
[58] Field of Search ................ 430/192, 190, 165, 326

[56] References Cited

U.S. PATENT DOCUMENTS

| | | | |
|---|---|---|---|
| 3,869,292 | 3/1975 | Peters | 430/192 |
| 4,139,384 | 2/1979 | Iwasaki et al. | 430/165 |
| 4,294,905 | 10/1981 | Okishi et al. | 430/157 |

OTHER PUBLICATIONS

Pacansky, J., *IBM Technical Disclosure Bulletin*, vol. 20, No. 7, 12/77, p. 2809.

*Primary Examiner*—Charles L. Bowers, Jr.
*Attorney, Agent, or Firm*—Sughrue, Mion, Zinn, Macpeak, and Seas

[57] ABSTRACT

A light-sensitive composition containing a high molecular compound and a light-sensitive o-naphthoquinonediazide compound is disclosed. The high molecular compound includes a structure unit represented by the general formula (I):

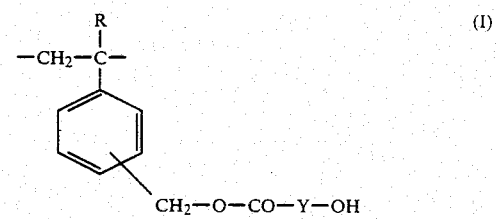

wherein R is a hydrogen atom or a methyl group, and Y is a phenylene group, a substituted phenylene group, a naphthylene group or a substituted naphthylene group. The light-sensitive composition makes possible the production of a light-sensitive material which can be developed under a wide range of development conditions to provide a lithographic printing plate having high printing durability.

12 Claims, No Drawings

LIGHT-SENSITIVE COMPOSITION

FIELD OF THE INVENTION

The present invention relates to a light-sensitive composition suited for producing lithographic printing plates, integrated circuits, and photomasks. More particularly, it relates to a light-sensitive composition comprising an o-naphthoquinonediazide compound and an alkali-soluble high molecular compound.

BACKGROUND OF THE INVENTION

Light-sensitive compositions comprising an o-naphthoquinonediazide compound and a novolak type phenol resin have been industrially employed in order to provide excellent light-sensitive compositions for producing lithographic printing plates or photoresists.

However, due to the properties of novolak type phenol resin used therein as a major component, they have poor adhesiveness to the base plate, form a fragile film, show poor coating properties and poor abrasion resistance and, when used for producing lithographic printing plates, give insufficient printing durability.

In order to remove the above-described defects, various high molecular compounds have been examined as binders. For example, Japanese Patent Publication No. 41050/77 discloses polyhydroxystyrene and hydroxystyrene copolymer, which still provide poor abrasion resistance though film properties are surely improved. Japanese Patent Application (OPI) No. 34711/76 proposes the use of a binder which is a high molecular compound having in its molecular structure a structural unit of acrylic acid derivative. However, the use of such a binder narrows suitable development conditions.

SUMMARY OF THE INVENTION

An object of the present invention is to provide a light-sensitive composition which makes it possible to develop under a wide range of development conditions and which gives a lithographic printing plate with high printing durability.

Another object of the present invention is to provide a light-sensitive composition which shows good adhesiveness to a base plate, provides a flexible film, and which possesses excellent coating properties.

As a result of various investigations, the inventors have found a light-sensitive composition containing a high molecular compound having in its molecule a structural unit represented by the following general formula (I):

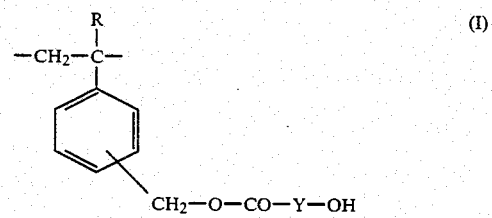

(I)

wherein R represents a hydrogen atom or a methyl group, and Y represents a phenylene group, a substituted phenylene group, a naphthylene group or a substituted naphthylene group, and, as a light-sensitive compound, an o-naphthoquinonediazide compound, which composition is useful for attaining the above-described objects.

DETAILED DESCRIPTION OF THE INVENTION

The characteristic aspect of the high molecular compound used in the present invention is the structural unit represented by the foregoing general formula (I). The high molecular polymer is a polymer containing only the repeating structural unit represented by the foregoing general formula (I) or a copolymer containing in combination the structural unit of the foregoing general formula (I) and one or more vinyl monomers.

In the copolymer of the high molecular compound of the present invention, structural units to be used in combination with the structural unit represented by the general formula (I) are, for example, those which are formed by bond cleavage of the unsaturated double bonds of vinyl monomers such as ethylenically unsaturated olefins (e.g., ethylene, propylene, isobutylene, butadiene, isobutylene, etc.), styrenes (e.g., styrene, α-methylstyrene, o-methylstyrene, m-methylstyrene, p-methylstyrene, o-chlorostyrene, p-chlorostyrene, etc.), acrylic acid and the esters thereof (e.g., acrylic acid, methyl acrylate, ethyl acrylate, isobutyl acrylate, n-butyl acrylate, hexyl acrylate, octyl acrylate, 2-hydroxyethyl acrylate, 2-cyanoethyl acrylate, glycidyl acrylate, dimethylaminoethyl acrylate, etc.), methacrylic acid and the esters thereof (e.g., methacrylic acid, methyl methacrylate, ethyl methacrylate, n-butyl methacrylate, isobutyl methacrylate, tert-butyl methacrylate, hexyl methacrylate, 2-ethylhexyl methacrylate, lauryl methacrylate, tridecyl methacrylate, cyclohexyl methacrylate, benzyl methacrylate, 2-hydroxyethyl methacrylate, 2-hydroxypropyl methacrylate, dimethylaminoethyl methacrylate, diethylaminoethyl methacrylate, glycidyl methacrylate, tetrahydrofurfuryl methacrylate, allyl methacrylate, etc.), vinyl esters (e.g., vinyl acetate, vinyl propionate, vinyl butyrate, vinyl caproate, vinyl benzoate, etc.), vinyl ethers (e.g., methyl vinyl ether, ethyl vinyl ether, isobutyl vinyl ether, β-chloroethyl vinyl ether, cyclohexyl vinyl ether, etc.), acrylonitrile, methacrylonitrile, acrylamides (e.g., acrylamide, N-methylacrylamide, N,N-dimethylacrylamide, N-tert-butylacrylamide, N-octylacrylamide, diacetoneacrylamide, etc.), N-vinyl compounds (e.g., N-vinylpyrrole, N-vinylcarbazole, N-vinylindole, N-vinylpyrrolidone, etc.), etc.

In the general formula (I), the phenylene group represented by Y includes a 1,2-phenylene group, 1,3-phenylene group, and 1,4-phenylene group, and the substituted phenylene group includes the above-described phenylene groups substituted by an alkyl group (e.g., a methyl group or an ethyl group), an alkoxy group (e.g., a methoxy group or an ethoxy group), a halogen atom (e.g., a chlorine atom or a bromine atom), a phenyl group, a hydroxy group, a carboxylic acid group, a sulfonic acid group, a cyano group, a nitro group, etc. More specifically, a 3-methyl-1,2-phenylene group, a 4-methyl-1,2-phenylene group, a 4-butyl-1,2-phenylene group, a 5-butyl-1,2-phenylene group, a 3,5-dibutyl-1,2-phenylene group, a 3-phenyl-1,2-phenylene group, a 5-chloro-1,2-phenylene group, a 5-bromo-1,2-phenylene group, a 3-nitro-1,4-phenylene group, a 2-hydroxy-1,4-phenylene group, a 3-hydroxy-1,4-phenylene group, a 5-hydroxy-1,2-phenylene group, a 2-hydroxy-1,3-phenylene group, a 5-hydroxy-1,3-phenylene group, a 6-hydroxy-1,2-phenylene group, a 4,6-dihydroxy-1,2-phenylene group, a 3,5-dihydroxy-1,4-phenylene group, a 3-carboxy-1,5-phenylene group, a 3-carboxy-1,4-phenylene group, etc. are preferable examples. The naphthylene group represented by Y is preferably a 1,2-naphthylene group or a 2,3-naphthylene group, and the substituted naphthylene group includes the above-described naphthylene groups substituted by an alkyl group (e.g., a methyl group or an ethyl group), an alkoxy group (e.g., a methoxy group or an ethoxy group), a halogen atom (e.g., a chlorine atom or a bromine atom), a phenyl group, a hydroxy group, a carboxylic acid group, a sulfonic acid group, a cyano group, a nitro group, etc. For example, a 4-hydroxy-1,2-naphthylene group, a 4-methoxy-1,2-naphthylene group, a 4-ethoxy-1,2-naphthylene group, a 4-(β-bromoethyloxy)-1,2-naphthylene group, a 4-(β-phenylethyloxy)-1,2-naphthylene group, etc. are preferable.

Typical specific examples of the high molecular compounds of the present invention are illustrated below. Additionally, x, y, and z in the following illustrative compounds each represents mol% of each structural unit.

No. 1
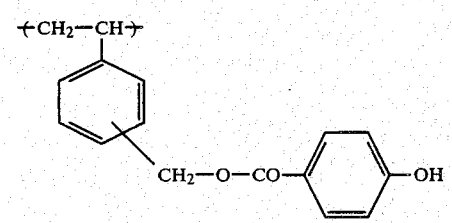

No. 2
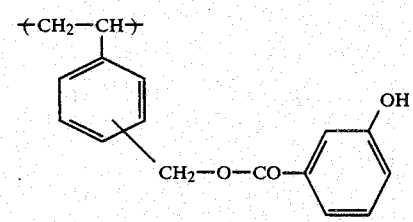

No. 3
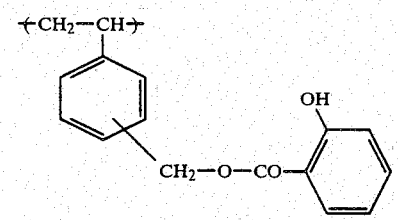

No. 4
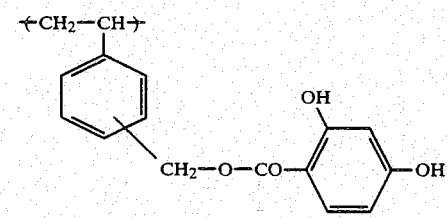

No. 5
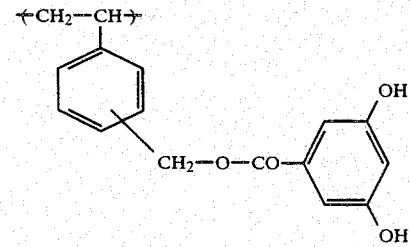

-continued

No. 6
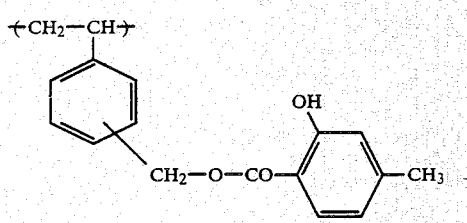

No. 7
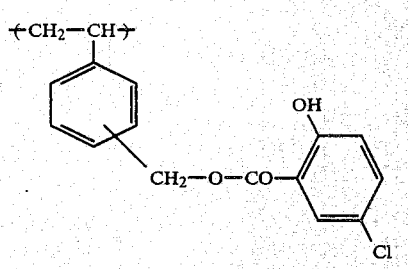

No. 8
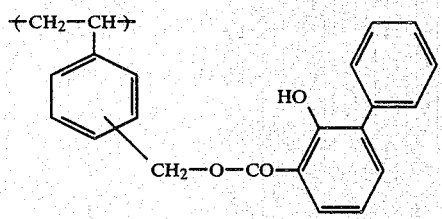

No. 9
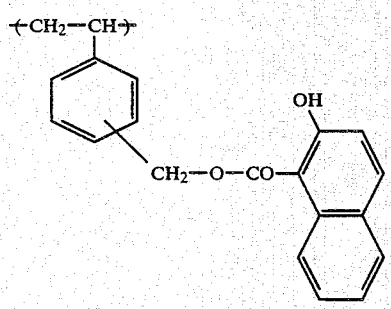

No. 10
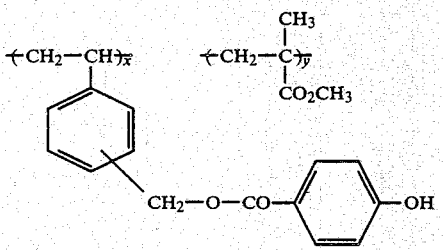

x:y = 27:73

No. 11
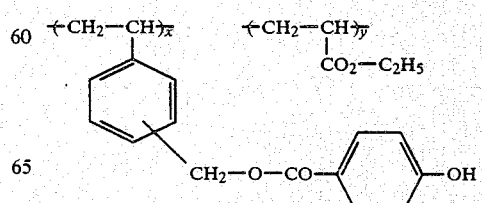

x:y = 49:51

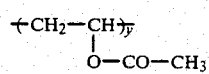
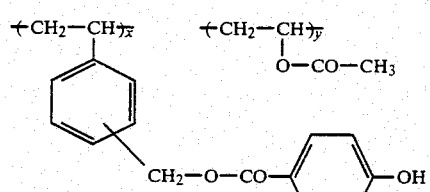
No. 12
x:y = 34:66

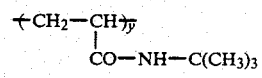
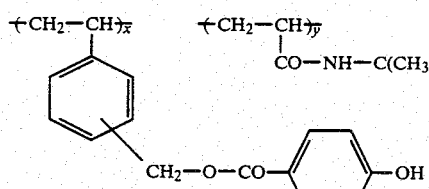
No. 13
x:y = 26:74

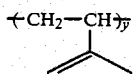
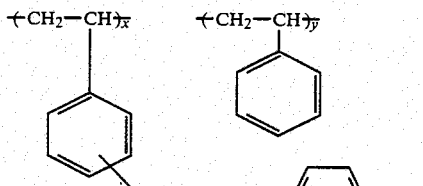
No. 14
x:y = 59:41

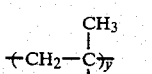
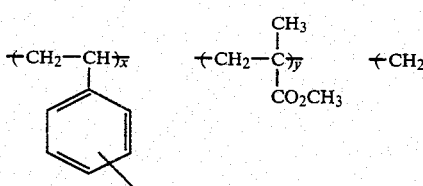
No. 15
x:y:z = 33:60:7

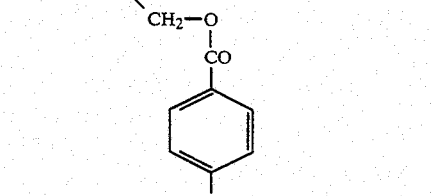
No. 16
x:y = 30:70

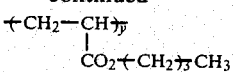
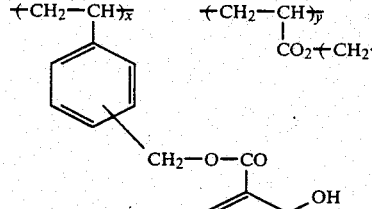
No. 17
x:y = 27:73

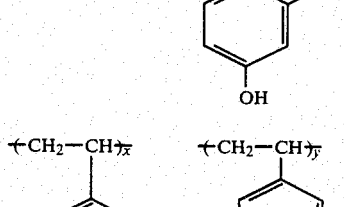
No. 18
x:y = 40:60

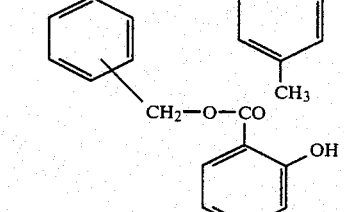
No. 19
x:y = 28:72

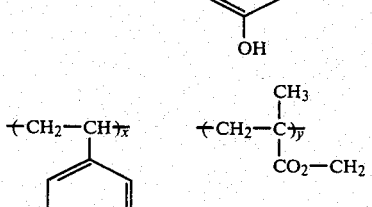
No. 20
x:y = 43:57

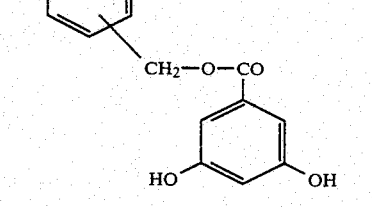

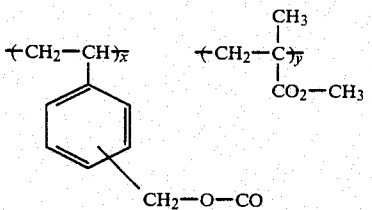

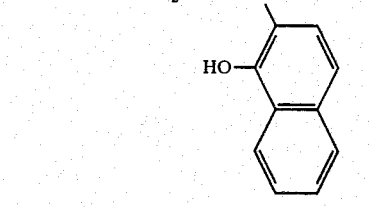

The high molecular compounds of the present invention are synthesized as follows. That is, a metal salt (e.g., sodium salt or potassium salt) of a benzoic or naphthoic acid derivative having a phenolic hydroxy group is reacted with vinylbenzyl chloride or isopropenylbenzyl chloride in a reaction solvent such as N,N-dimethylformamide, N,N-dimethylacetamide, N-methylpyrrolidone or dimethylsulfoxide to synthesize a monomer having a phenolic hydroxy group, and the resulting monomer is homopolymerized or copolymerized with at least one vinyl monomer other than the above-described monomer in a conventional manner.

The copolymerization ratio and molecular weight of the high molecular compound can be arbitrarily controlled over a wide range by selecting the proper molecular proportion of each monomer and polymerization condition. However, for the use intended in the present invention, the molecular weight is preferably 2,000 to 1,000,000, more preferably 2,000 to 100,000. When copolymerizing with another vinyl monomer or monomers than the structural unit represented by the foregoing general formula (I), the resulting copolymer preferably contains 10 mol% or more of the structural unit represented by the general formula (I), more preferably 20 mol% or more of the structural unit of the general formula (I).

Typical synthesis examples for synthesizing the high molecular compounds of the present invention are given below.

SYNTHESIS EXAMPLE 1

(Synthesis of illustrative compound No. 1)

71.5 g of vinylbenzyl chloride and 75.0 g of sodium p-hydroxybenzoate were added to 250 ml of dimethylsulfoxide and stirred and reacted at 40° C. for 4 days. Then 1,000 ml of water was added thereto, and the resulting mixture was extracted with 200 ml of ethyl acetate. After distilling off ethyl acetate, recrystallization of the residue from benzene-hexane mixture solvent yielded 110 g of vinylbenzyl p-hydroxybenzoate (m.p. 83°–85° C.).

40.7 g of vinylbenzyl p-hydroxybenzoate was dissolved in 100 g of methyl ethyl ketone, and polymerization was conducted for 7 hours under heating to 70° C. in a nitrogen stream in the presence of 0.08 g of 2,2'-azobis(2,4-dimethylvaleronitrile). After completion of the polymerization, the reaction solution cooled to room temperature was thrown into a large quantity of benzene to obtain a high molecular compound shown by illustrative compound No. 1 (yield: 32.0 g; molecular weight: 8,600).

SYNTHESIS EXAMPLE 2

(Synthesis of illustrative compound No. 4)

154.0 g of potassium 2,4-dihydroxybenzoate and 122.3 g of vinylbenzyl chloride were added to 500 ml of dimethylsulfoxide, and stirred at 40° C. for 3 days to react. Then, 1,000 ml of water was added thereto, and the resulting mixture was extracted with 500 ml of ethyl acetate. After distilling off ethyl acetate, recrystallization of the residue from a benzene-hexane mixture solvent yielded 140 g of vinylbenzyl 2,4-dihydroxybenzoate (m.p. 52°–54° C.).

43.2 g of vinylbenzyl 2,4-dihydroxybenzoate was dissolved in 100 g of methyl ethyl ketone, and polymerization was conducted for 7 hours in a nitrogen stream under heating to 70° C. in the presence of 0.08 g of 2,2'-azobis(2,4-dimethylvaleronitrile). After completion of the polymerization, the reaction solution was thrown into a large quantity of hexane to obtain a high molecular compound shown by illustrative compound No. 4 (yield: 33 g; molecular weight: 6,700).

SYNTHESIS EXAMPLE 3

(Synthesis of illustrative compound No. 5)

129.4 g of potassium 3,5-dihydroxybenzoate and 102.7 g of vinylbenzyl chloride were added to 700 ml of dimethylsulfoxide and stirred and reacted at 40° C. for 4 days. Then, 1,500 ml of water was added thereto, and the resulting mixture was extracted with 500 ml of ethyl acetate. After distilling off ethyl acetate, recrystallization of the residue from an ethyl acetate-toluene mixture solvent yielded 152 g of vinylbenzyl 3,5-dihydroxybenzoate (m.p. 117°–119° C.).

43.2 g of vinylbenzyl 3,5-dihydroxybenzoate was dissolved in 100 g of methyl ethyl ketone, and polymerization was conducted for 7 hours in a nitrogen stream under heating to 70° C. in the presence of 0.08 g of 2,2'-azobis(2,4-dimethylvaleronitrile). After completion of the polymerization, the reaction solution was thrown into a large quantity of hexane to obtain a high molecular compound shown by illustrative compound No. 5 (yield: 36 g; molecular weight: 7,600).

SYNTHESIS EXAMPLE 4

(Synthesis of illustrative compound No. 10)

38.1 g of vinylbenzyl p-hydroxybenzoate synthesized in Synthesis Example 1 and 35.0 g of methyl methacrylate were dissolved in 150 ml of methyl ethyl ketone, and polymerization was conducted for 7 hours in a nitrogen stream under heating to 70° C. in the presence of 0.124 g of 2,2'-azobis(2,4-dimethylvaleronitrile). After completion of the polymerization, the reaction solution was thrown into a large quantity of hexane to obtain a high molecular compound shown by the structure of illustrative compound No. 10 (yield: 52 g; molecular weight: 21,000).

SYNTHESIS EXAMPLE 5

(Synthesis of illustrative compound No. 11)

38.1 g of vinylbenzyl p-hydroxybenzoate synthesized in Synthesis Example 1 and 10.0 g of ethyl acrylate were dissolved in 100 ml of methyl ethyl ketone, and polymerization was conducted for 7 hours in a nitrogen stream under heating to 70° C. in the presence of 0.124 g of 2,2'-azobis(2,4-dimethylvaleronitrile). After completion of the polymerization, the reaction solution was thrown into a large quantity of hexane to obtain a high molecular compound shown by the structure of illustrative compound No. 11 (yield: 29 g; molecular weight: 48,500).

SYNTHESIS EXAMPLE 6

(Synthesis of illustrative compound No. 14)

38.1 g of vinylbenzyl p-hydroxybenzoate synthesized in Synthesis Example 1 and 10.4 g of styrene were dissolved in 100 ml of methyl ethyl ketone, and polymerization was conducted for 7 hours in a nitrogen stream under heating to 70° C. in the presence of 0.124 g of 2,2'-azobis(2,4-dimethylvaleronitrile). After completion of the polymerization, the reaction solution was thrown into a large quantity of hexane to obtain a high molecular compound shown by the structure of illustrative compound No. 14 (yield: 31 g; molecular weight: 46,000).

SYNTHESIS EXAMPLE 7

(Synthesis of illustrative compound No. 16)

40.5 g of vinylbenzyl 2,4-dihydroxybenzoate synthesized in Synthesis Example 2 and 35.0 g of methyl methacrylate were dissolved in 250 ml of methyl ethyl ketone, and polymerization was conducted for 7 hours in a nitrogen stream under heating to 70° C. in the presence of 0.124 g of 2,2′-azobis(2,4-dimethylvaleronitrile). After completion of the polymerization, the reaction solution was thrown into a large quantity of hexane to obtain a high molecular compound shown by the structure of illustrative compound No. 16 (yield: 44 g; molecular weight: 26,000).

SYNTHESIS EXAMPLE 8

(Synthesis of illustrative compound No. 19)

32.4 g of vinylbenzyl 3,5-dihydroxybenzoate synthesized in Synthesis Example 3 and 28.0 g of methyl methacrylate were dissolved in 200 ml of methyl ethyl ketone, and polymerization was conducted for 7 hours in a nitrogen stream under heating to 70° C. in the presence of 0.099 g of 2,2′-azobis(2,4-dimethylvaleronitrile). After completion of the polymerization, the reaction solution was thrown into a large quantity of hexane to obtain a high molecular compound shown by the structure of illustrative compound No. 19 (yield: 54 g; molecular weight: 42,000).

As the o-naphthoquinonediazide compound to be used in the present invention, an ester between 1,2-diazonaphthoquinonesulfonyl chloride and pyrogallol-acetone resin described in U.S. Pat. No. 3,635,709 is the most preferable. Another preferable o-quinonediazide compound is an ester between 1,2-diazonaphthoquinonesulfonyl chloride and phenol-formaldehyde resin described in U.S. Pat. Nos. 3,046,120 and 3,188,210. Other useful o-naphthoquinonediazide compounds are known and have been reported in many patents. For example, there are illustrated those described in Japanese Patent Application (OPI) Nos. 5303/72, 63802/73, 63803/73, 96575/73, 38701/74, 13354/73, Japanese Patent Publication Nos. 11222/66, 9610/70, 17481/74, U.S. Pat. Nos. 2,797,213, 3,454,400, 3,544,323, 3,573,917, 3,674,495, 3,785,825, British Pat. Nos. 1,227,602, 1,251,345, 1,267,005, 1,329,888, 1,330,932, German Pat. No. 854,890, etc.

The o-naphthoquinonediazide compound is present in the light-sensitive composition of the present invention in an amount of 10 to 50 wt%, preferably 20 to 40 wt%. The content of the high molecular compound in the light-sensitive composition is 90 to 5 wt%, preferably 60 to 10 wt%.

In the composition of the present invention may be incorporated, in addition to the high molecular compound described above, known alkali-soluble high molecular compounds such as a phenol-formaldehyde resin, a cresol-formaldehyde resin, a phenol-modified xylene resin, polyhydroxystyrene, and polyhalogenated hydroxystyrene. Such alkali-soluble high molecular compounds are used in an amount of 70 wt% or less based on the weight of the whole composition.

To the composition of the present invention may be added a cyclic acid anhydride for raising sensitivity, a printing-out agent for obtaining a visible image immediately after exposure, an image colorant such as a dye, and other fillers. Examples of useful cyclic acid anhydrides include phthalic anhydride, tetrahydrophthalic anhydride, hexahydrophthalic anhydride, 3,6-endoxy-Δ⁴-tetrahydrophthalic anhydride, tetrachlorophthalic anhydride, maleic anhydride, chloromaleic anhydride, α-phenylmaleic anhydride, succinic anhydride, pyromellitic acid anhydride, etc. as described in U.S. Pat. No. 4,115,128. Sensitivity can be raised to about 3 times at the highest by incorporating these cyclic acid anhydrides in a content of 1 to 15 wt% based on the whole composition. The printing-out agent for obtaining visible image immediately after exposure may be a combination of a light-sensitive compound capable of releasing acid upon exposure and an organic dye capable of forming a salt. Specific examples include a combination of o-naphthoquinonediazido-4-sulfonyl halide and a salt-forming organic dye described in U.S. Pat. No. 3,969,118 and Japanese Patent Application (OPI) No. 8128/78 and a combination of a trihalomethyl compound and a salt-forming organic dye described in U.S. Pat. Nos. 4,160,671 and 4,212,970. Useful image colorants include other dyes than the above-described salt-forming organic dyes. Preferable dyes include salt-forming organic dyes, oil-soluble dyes and basic dyes. Specific examples include Oil Yellow #101, Oil Yellow #130, Oil Pink #312, Oil Green BG, Oil Blue BOS, Oil Blue #603, Oil Black BY, Oil Black BS, Oil Black T-505 (so far made by Orient Kagaku Kogyo Co., Ltd.), Crystal Violet (CI 42555), Methyl Violet (CI 42535), Rhodamine B (CI 45170B), Malachite Green (CI 42000) and Methylene Blue (CI 52015).

The composition of the present invention is dissolved in a solvent capable of dissolving the above-described ingredients and coated on a support. Solvents used for dissolving the composition include ethylene dichloride, cyclohexanone, methyl ethyl ketone, ethylene glycol monomethyl ether, ethylene glycol monoethyl ether, 2-methoxyethyl acetate, toluene, ethyl acetate, etc. These are used alone or in combination. Concentration of the solids of the above-described ingredients is 2 to 50 wt.%. The coating amount varies depending upon the end-use. With light-sensitive lithographic printing plates, for example, concentration of the solids is generally 0.5 to 3.0 g/m². As the coating amount decreases, physical properties of the light-sensitive membrane deteriorate while their sensitivity increases.

In producing a lithographic printing plate using the light-sensitive composition of the present invention, an aluminum plate having been rendered hydrophilic such as a silicate-treated aluminum plate, an anodized aluminum plate, a grained aluminum plate or a silicate-electro-deposited aluminum plate, a zinc plate, a stainless steel plate, a chromium-treated steel plate, plastic film or paper having been rendered hydrophilic, and the like can be used as a support.

Useful developing solutions for the light-sensitive composition of the present invention include an aqueous solution of inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, or aqueous ammonia is suitable. The alkali agent is added in such amount that a developing solution containing 0.1 to 10 wt%, preferably 0.5 to 5 wt%, of the agent is prepared.

To the alkaline aqueous solution may be added, if necessary, a surfactant and an organic solvent such as an alcohol.

The present invention will now be described in more detail by the following non-limiting examples of preferred embodiments of the present invention. The percents in the following examples are all by weight unless otherwise specified.

EXAMPLE 1

A 0.15-mm thick 2S aluminum plate was dipped for 3 minutes in a 10% aqueous solution of sodium tertiary phosphate kept at 80° C. in order to degrease the plate which was then grained by a nylon brush, and desmutted in a 3% aqueous solution of sodium hydrogensulfate. This aluminum plate was treated with a 70° C. aqueous solution containing 1.5% sodium silicate for one minute to prepare aluminum plate (I).

The following light-sensitive solution (A) was coated on this aluminum plate (I), and dried at 100° C. for 2 minutes to prepare light-sensitive lithographic printing plate (A).

| Light-sensitive solution (A) | |
| --- | --- |
| An ester product between naphthoquinone-1,2-diazido-5-sulfonyl chloride and pyrogallol-acetone resin (described in U.S. Pat. No. 3,635,709, Example 1) | 0.9 g |
| Illustrative compound No. 1 obtained in Synthesis Example 1 | 1.9 g |
| Phthalic anhydride | 0.2 g |
| 2-(p-Butoxyphenyl)-4,6-bis(trichloromethyl)-s-triazine | 0.02 g |
| Naphthoquinone-1,2-diazido-4-sulfonyl chloride | 0.02 g |
| Oil-soluble dye (CI 42595) | 0.03 g |
| Ethylene dichloride | 15 g |
| Methyl cellosolve | 8 g |

Light-sensitive solution (B), prepared by using cresol-formaldehyde resin in place of illustrative compound No. 1 in the formulation of light-sensitive solution (A), was coated on aluminum plate (I) in the same manner as with light-sensitive solution (A) to prepare light-sensitive lithographic printing plate (B). With both light-sensitive lithographic printing plates (A) and (B), the dry coating weight was about 2.5 g/m$^2$. A positive transparency having a line image and a half-tone image was intimately superposed on the light-sensitive layer of each of (A) and (B), and exposure was conducted using a 30 ampere carbon arc lamp spaced at a distance of 70 cm.

The thus exposed light-sensitive lithographic printing plates (A) and (B) were dipped in a 4% sodium metasilicate aqueous solution for one minute to develop, then treated in a conventional manner to obtain lithographic printing plates (A) and (B), respectively. When loaded on an offset press, the number of durable printing sheets produced with the lithographic printing plate (B) was found to be about 40,000, whereas that of the lithographic printing plate (A) was about 80,000. Thus, the great printing durability of the lithographic printing plate (A) was confirmed. In addition, the proper developing condition range for the lithographic printing plate was about as wide as that for the lithographic printing plate (B).

EXAMPLE 2

A 0.24-mm thick 2S aluminum plate was dipped for 3 minutes in a 10% sodium tertiary phosphate aqueous solution kept at 80° C. in order to degrease the plate which was then grained by a nylon brush, etched with sodium aluminate for about 10 seconds, and desmutted with a 3% aqueous solution of sodium hydrogensulfate. This aluminum plate was anodized for 2 minutes in 20% sulfuric acid at a current density of 2 A/dm$^2$ to prepare aluminum plate (II).

The following light-sensitive solution (C) was coated on this aluminum plate (II) and dried at 100° C. for 2 minutes to prepare light-sensitive lithographic printing plate (C).

| Light-sensitive solution (C) | |
| --- | --- |
| An ester product between naphthoquinone-1,2-diazido-5-sulfonyl chloride and cresol-formaldehyde resin | 0.90 g |
| Illustrative compound No. 16 obtained in Synthesis Example 7 | 1.0 g |
| Cresol-formaldehyde resin | 0.9 g |
| Oil-soluble dye (CI 42595) | 0.04 g |
| Naphthoquinone-1,2-diazido-4-sulfonyl chloride | 0.02 g |
| Methyl cellosolve | 20 g |
| Methyl ethyl ketone | 20 g |

Light-sensitive solution (D), prepared by using cresol-formaldehyde resin in place of illustrative compound No. 16 in the formulation of light-sensitive solution (C), was coated on aluminum plate (II) in the same manner as with light-sensitive solution (C) to prepare light-sensitive lithographic printing plate (D). With both light-sensitive lithographic printing plates (C) and (D), dry coating weight was 2.5 g/m$^2$. These plates (C) and (D) were exposed and developed in the same manner as in Example 1, and loaded on an offset press to print. The number of durable printing sheets produced with the lithographic printing plate (D) was found to be about 100,000, whereas that of the lithographic printing plate (C) was about 150,000. Thus, the excellent printing durability of the lithographic printing plate (C) was confirmed.

While the invention has been described in detail and with reference to specific embodiments thereof, it will be apparent to one skilled in the art that various changes and modifications can be made therein without departing from the spirit and scope thereof.

What is claimed is:

1. A light-sensitive composition, comprising: 90 to 5 wt % of a high molecular compound as a homopolymer or a copolymer having in its molecular structure a structure unit represented by the general formula (I):

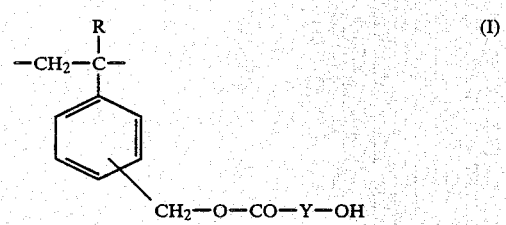

wherein R is a hydrogen atom or a methyl group, and Y is a phenylene group, a substituted phenylene group, a naphthylene group or a substituted naphthylene group in admixture with 10 to 50 wt % based on the light-sensitive composition, of a light-sensitive o-naphthoquinone-diazide compound.

2. A light-sensitive composition as claimed in claim 1, wherein the high molecular compound is further comprised of vinyl monomer units.

3. A light-sensitive composition as claimed in claim 1, wherein Y is selected from the group consisting of a 1,2-naphthylene group, and a 2,3-naphthylene group.

4. A light-sensitive composition as claimed in claim 1, wherein Y is selected from the group consisting of a 4-hydroxy-1,2-naphthylene group, a 4-methoxy-1,2- naphthylene group, a 4-ethoxy-1,2-naphthylene group, a 4-(β-bromoethyloxy)-1,2-naphthylene group, and a 4-(β-phenylethyloxy)-1,2-naphthylene group.

5. A light-sensitive composition as claimed in claim 1, wherein the high molecular compound has a molecular weight within the range of 2,000 to 1,000,000.

6. A light-sensitive composition as claimed in claim 1, wherein the high molecular compound has a molecular weight within the range of 2,000 to 100,000.

7. A light-sensitive composition as claimed in claim 1, wherein the high molecular compound includes the structure unit of general formula (I) in an amount of 10 mol% or more.

8. A light-sensitive compositions as claimed in claim 7, wherein the high molecular compound contains the structure unit of general formula (I) in an amount of 20 mol% or more.

9. A light-sensitive composition as claimed in claim 1, wherein the high molecular compound is present in an amount within the range of 10 to 60 wt%.

10. A light-sensitive composition as claimed in claim 1, wherein the o-naphthoquinone-diazide compound is present in an amount within the range of 20 to 40 wt%.

11. A light-sensitive composition as claimed in claim 1, further comprising an alkali-soluble high molecular compound in an amount of 70 wt% or less.

12. A light-sensitive composition as claimed in claim 1, further comprising a cyclic acid anhydride in an amount of 1 to 15 wt% based on the weight of the light-sensitive composition.

* * * * *